(12) United States Patent
Chen

(10) Patent No.: US 9,595,482 B2
(45) Date of Patent: Mar. 14, 2017

(54) STRUCTURE FOR DIE PROBING

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/658,951

(22) Filed: Mar. 16, 2015

(65) Prior Publication Data
US 2016/0276235 A1 Sep. 22, 2016

(51) Int. Cl.
*H01L 21/56* (2006.01)
*H01L 21/66* (2006.01)
(Continued)

(52) U.S. Cl.
CPC ............ *H01L 22/14* (2013.01); *H01L 23/481* (2013.01); *H01L 23/5389* (2013.01); *H01L 24/19* (2013.01); *H01L 24/20* (2013.01); *H01L 25/105* (2013.01); *H01L 25/50* (2013.01); *H01L 21/568* (2013.01); *H01L 23/3128* (2013.01);
(Continued)

(58) Field of Classification Search
CPC ....... H01L 2225/1058; H01L 2224/023; H01L 2224/0233; H01L 2224/16227; H01L 23/49827; H01L 2224/81191; H01L 21/563; H01L 2225/1041; H01L 2924/15311; H01L 24/83; H01L 2224/10125; H01L 2924/00014; H01L 23/5226; H01L 2224/73267; H01L 2225/0651; H01L 2225/1035; H01L 2224/83191; H01L 2224/92244; H01L 2224/32145; H01L 2224/32225; H01L 2224/48247; H01L 2224/94; H01L 25/105; H01L 25/50; H01L 2224/04042; H01L 23/5389; H01L 24/19; H01L 24/20; H01L 24/32; H01L 24/73; H01L 21/568; H01L 23/481; H01L 23/3128; H01L 23/49833
See application file for complete search history.

(56) References Cited

U.S. PATENT DOCUMENTS

RE43,380 E * 5/2012 Wakisaka ............ H01L 23/5389
257/684
8,183,696 B2 5/2012 Meyer et al.
(Continued)

FOREIGN PATENT DOCUMENTS

DE 102011001405 10/2011
JP 2014203963 10/2014
KR 20100119507 A 11/2010

*Primary Examiner* — Jasmine Clark
(74) *Attorney, Agent, or Firm* — Slater Matsil, LLP

(57) ABSTRACT

A package includes a device die, which includes a metal pillar at a top surface of the device die, and a solder region on a sidewall of the metal pillar. A molding material encircles the device die, wherein a top surface of the molding material is substantially level with a top surface of the device die. A dielectric layer overlaps the molding material and the device die, with a bottom surface of the dielectric layer contacting a top surface of the device die and a top surface of the molding material. A redistribution line (RDL) extends into the dielectric layer to electrically couple to the metal pillar.

20 Claims, 22 Drawing Sheets

(51) Int. Cl.
  H01L 23/00    (2006.01)
  H01L 23/31    (2006.01)
  H01L 23/48    (2006.01)
  H01L 23/498   (2006.01)
  H01L 25/10    (2006.01)
  H01L 25/00    (2006.01)
  H01L 23/538   (2006.01)
  H01L 25/065       (2006.01)
  H01L 23/522       (2006.01)

(52) U.S. Cl.
  CPC .... *H01L 23/49833* (2013.01); *H01L 23/5226* (2013.01); *H01L 24/32* (2013.01); *H01L 24/48* (2013.01); *H01L 24/73* (2013.01); *H01L 24/83* (2013.01); *H01L 24/92* (2013.01); *H01L 25/0657* (2013.01); *H01L 2224/04042* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/83191* (2013.01); *H01L 2224/92244* (2013.01); *H01L 2224/94* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/37001* (2013.01)

(56) References Cited

U.S. PATENT DOCUMENTS

| | | |
|---|---|---|
| 8,361,842 B2 | 1/2013 | Yu et al. |
| 8,586,467 B2 * | 11/2013 | Suzuki ............... C08L 63/00 257/737 |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2001/0015439 A1 | 8/2001 | Hembree et al. |
| 2005/0017376 A1 * | 1/2005 | Tsai ..................... H01L 24/10 257/786 |
| 2005/0161803 A1 * | 7/2005 | Mihara ............... H01L 24/97 257/698 |
| 2010/0276787 A1 | 11/2010 | Yu et al. |
| 2011/0121295 A1 | 5/2011 | Kuan et al. |
| 2011/0291288 A1 | 12/2011 | Wu et al. |
| 2011/0298137 A1 | 12/2011 | Pagaila et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0069623 A1 | 3/2015 | Tsai et al. |

\* cited by examiner

STRUCTURE FOR DIE PROBING

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
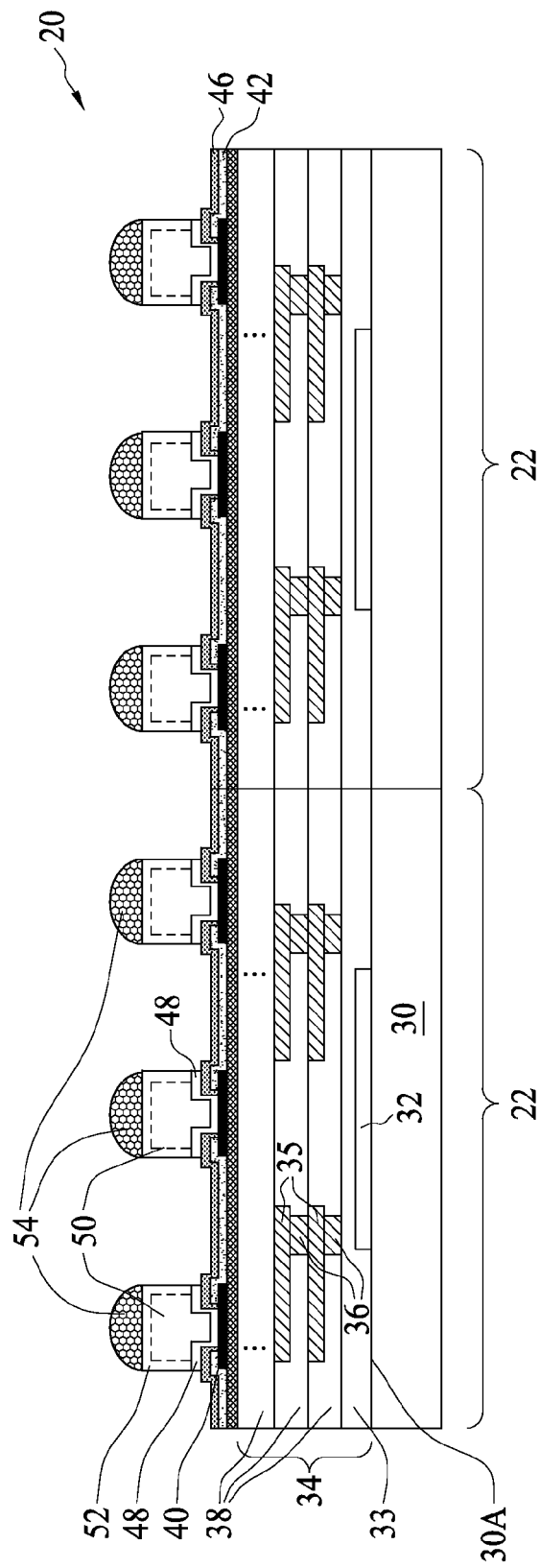
FIGS. 1 through 3 illustrate the cross-sectional views of intermediate stages in the formation of device dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 22:
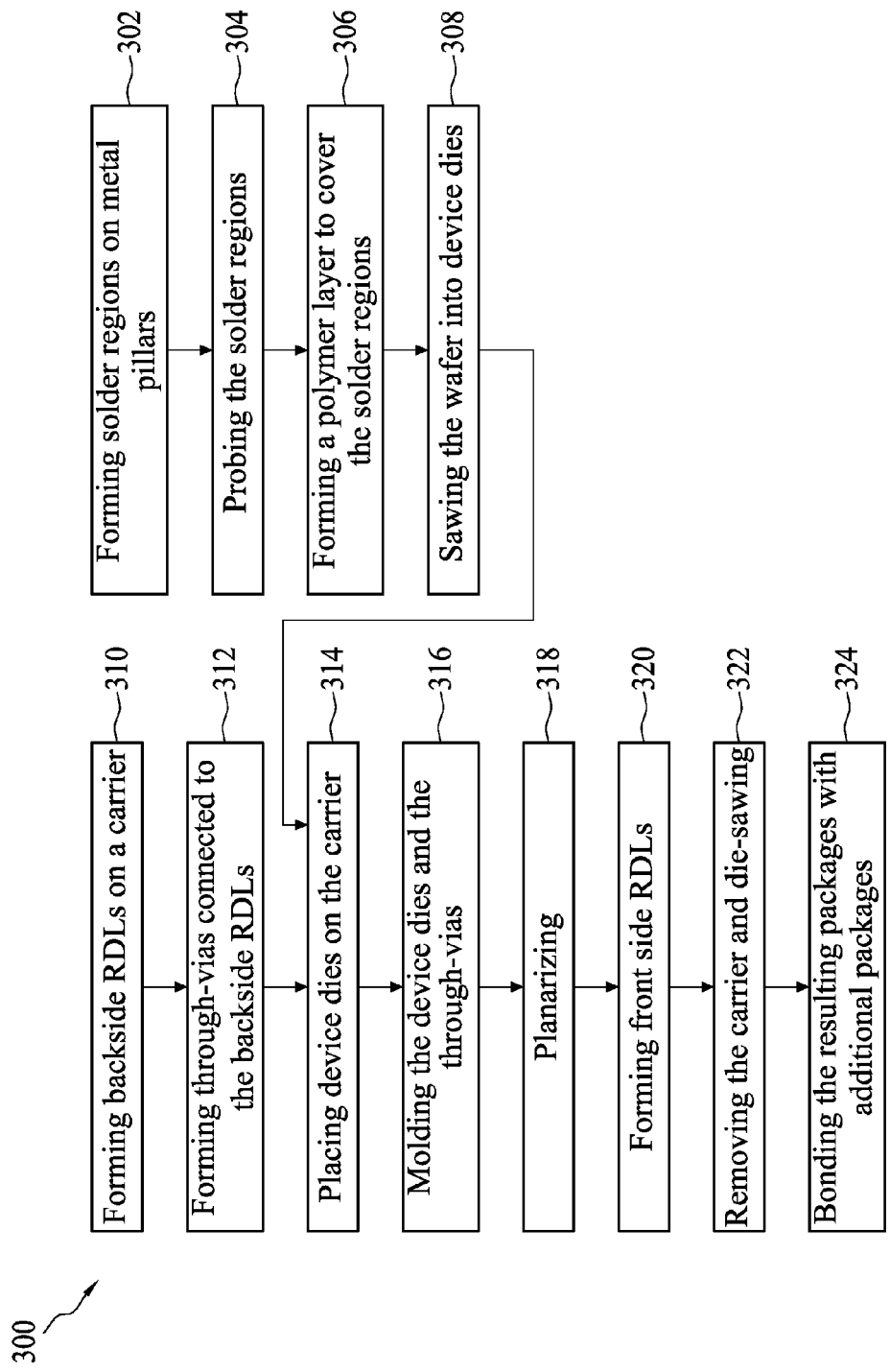
FIG. 22 is a process flow of the packaging process shown in FIGS. 1 through 18.

FIGS. 1 through 18 illustrate the cross-sectional views of intermediate stages in the formation of Integrated Fan-Out (InFO) structures in accordance with some embodiments. The steps shown in FIGS. 1 through 18 are also illustrated schematically in the process flow 300 as shown in FIG. 22. In the subsequent discussion, the process steps shown in FIGS. 1 through 18 are discussed referring to the process steps in FIG. 22.

FIG. 1 illustrates a cross-sectional view of wafer 20 in accordance with exemplary embodiments. Wafer 20 includes a plurality of semiconductor chips 22 therein. Wafer 20 further includes semiconductor substrate 30, which extends into semiconductor chips 22. Semiconductor substrate 30 may be a bulk silicon substrate or a silicon-on-insulator substrate. Alternatively, semiconductor substrate 30 may include other semiconductor materials including group III, group IV, and group V elements. Integrated circuit 32 is formed at surface 30A of semiconductor substrate 30. Integrated circuit 32 may include Complementary Metal-Oxide-Semiconductor (CMOS) transistors therein.

Device dies 22 may further include Inter-Layer Dielectric (ILD) 33 over semiconductor substrate 30, and interconnect structure 34 over ILD 33. Interconnect structure 34 includes dielectric layers 38, and metal lines 35 and vias 36 formed in dielectric layers 38. In accordance with some embodiments of the present disclosure, dielectric layers 38 are formed of low-k dielectric materials. The dielectric constants (k values) of the low-k dielectric materials may be less than about 2.8, or less than about 2.5, for example. Metal lines 35 and vias 36 may be formed of copper, a copper alloy, or other metal-containing conductive materials. Metal lines 35 and vias 36 may be formed using single damascene and/or dual damascene processes.

Metal pads 40 are formed over interconnect structure 34, and may be electrically coupled to circuit 32 through metal lines 35 and vias 36 in interconnect structure 34. Metal pads 40 may be aluminum pads or aluminum-copper pads, or may include other metals. In accordance with some embodiments of the present disclosure, the metal features that are underlying and contacting metal pad 40 are metal lines. In alternative embodiments, the metal features that are underlying and contacting metal pads 40 are metal vias.

Passivation layer 42 is formed to cover the edge portions of metal pads 40. The central portions of each of metal pads 40 is exposed through an opening in passivation layer 42. Passivation layer 42 may be formed of a non-porous material. In accordance with some embodiments of the present disclosure, passivation layer 42 is a composite layer comprising a silicon oxide layer (not shown), and a silicon nitride layer (not shown) over the silicon oxide layer. In alternative embodiments, passivation layer 42 comprises Un-doped Silicate Glass (USG), silicon oxynitride, and/or the like. Although one passivation layer 42 is shown, there may be more than one passivation layer.

Polymer layer 46 is formed over passivation layer 42 and covers passivation layer 42. Polymer layer 46 may comprise a polymer such as an epoxy, polyimide, benzocyclobutene (BCB), polybenzoxazole (PBO), and the like. Polymer layer 46 is patterned to form openings, through which metal pads 40 are exposed.

Under-Bump Metallurgies (UBM) 48 are formed over metal pads 40. UBMs 48 comprise first portions over polymer layer 46, and second portions extending into the openings in polymer layer 46 and passivation layer 42 to electrically couple to metal pads 40. In accordance with some embodiments of the present disclosure, each of UBMs 48 includes a titanium layer and a seed layer that is formed of copper or a copper alloy.

In accordance with some embodiments, metal pillars 50 are formed over the respective UBMs 48, and are co-terminus with the respective UBMs 48. For example, the edges of each of metal pillar 50 are aligned to the corresponding edges of the respective UBM 48. Accordingly, the lateral dimensions of metal pillars 50 are also equal to the respective lateral dimensions of UBMs 48. UBMs 48 may be in physical contact with the respective overlying metal pillars 50. In some exemplary embodiments, metal pillars 50 are formed of a non-solder material that does not melt in reflow processes for melting solder. For example, metal pillars 50 may be formed of copper or a copper alloy.

Solder caps 54 are formed on the top surfaces of metal pillars 50, wherein solder caps 54 may be formed of a Sn—Ag alloy, a Sn—Cu alloy, a Sn—Ag—Cu alloy, or the like, and may be lead-free solder caps or lead-containing solder caps. The respective step is shown as step 302 in the process flow shown in FIG. 22. In some exemplary embodiments, the entire metal pillars 50 are formed of a homogenously metallic material, with solder caps 54 contacting metal pillars 50. In alternative embodiments, there may be additional metal layers 52 formed as conformal layers contacting the top surfaces and sidewall surfaces of metal pillars 50. Metal layers 52 are marked using dashed lines to indicate that they may or may not be formed. Each of the metal layers 52 may fully encircle the respective metal pillars 50, and may include a top portion overlapping the respective metal pillars 50. Metal layers 52 may be formed of titanium, nickel, palladium, gold, or alloys thereof. Metal layers 52 are used as diffusion barrier layers.

In some exemplary embodiments, the formation of UBMs 48 and metal pillars 50 include performing a Physical Vapor Deposition (PVD) process to form a blanket UBM layer (not shown), wherein UBMs 48 are the remaining portions of the UBM layer), and forming and patterning a mask layer (not shown) over the blanket UBM layer. The mask layer may be a photo resist coating or a dry film. Metal pillars 50 and solder caps 54 are then formed in the openings of the mask layer, through which openings the blanket UBM layer is exposed. Metal pillars 50 and solder caps 54 are then formed by plating. After the formation of metal pillars 50 and solder caps 54, the mask layer is removed. The portions of the UBM layer that are covered by the patterned mask layer are removed, leaving metal pillars 50 and solder caps 54 un-removed.

Figure 2:
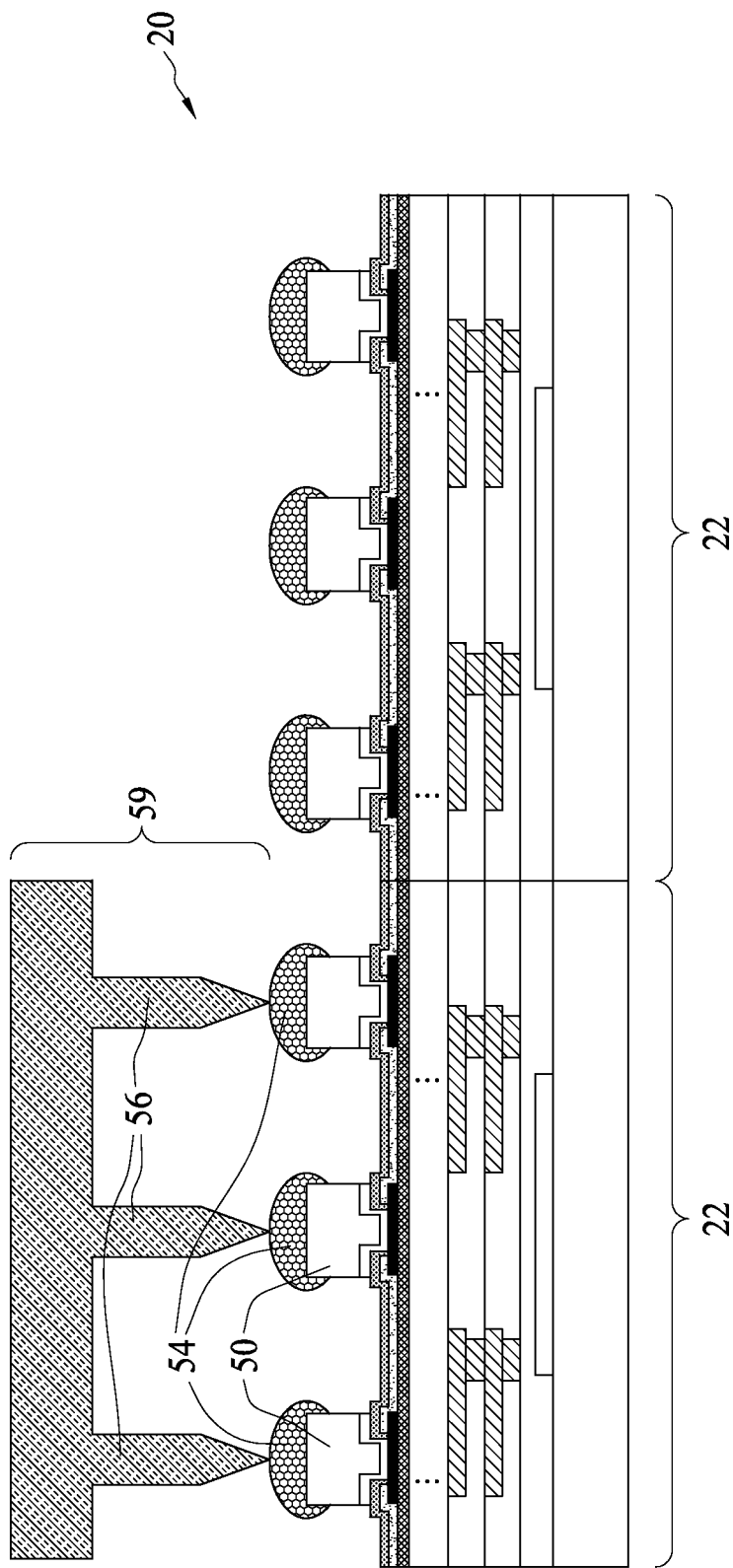

A reflow may be performed, so that solder caps 54 have round top surfaces. The reflowed solder caps 54 are referred to as solder regions 54 hereinafter. The solder in solder caps 54 include some portions remaining overlapping metal pillars 50, and some other portions flowing down to contact the sidewalls of metal pillars 50, as shown in FIG. 2. Solder regions 54 may not cover the bottom portions of the sidewalls of metal pillars 50.

Next, a probing step is performed on solder regions 54 to test the electrical properties of device dies 22. The respective step is shown as step 304 in the process flow shown in FIG. 22. The probing is performed by putting probe pins 56 in contact with solder regions 54. Probe pins 56 are parts of probe card 59, which is electrically connected to a test equipment (not shown). Through the probing, defect device dies 22 are found, and good dies are determined. Advantageously, solder regions 54 are softer than the underlying metal pillars 50. Accordingly, the contact between probe pins 56 and solder regions 54 is better than the contact between probe pins 56 and metal pillars 50. Hence, the probing is more reliable than if solder regions 54 are not formed.

Figure 3:
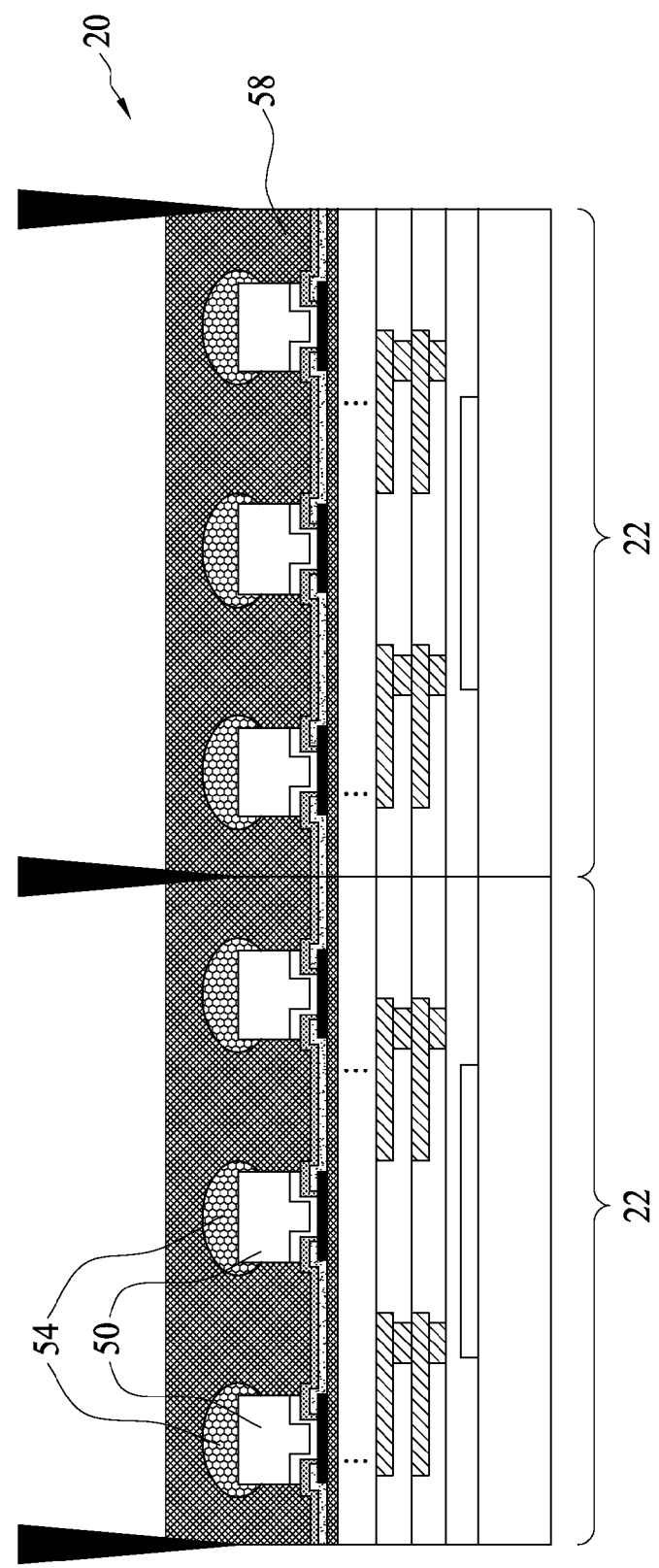

After the probing, polymer layer 58 is formed to cover the top surface of wafer 20, as shown in FIG. 3. The respective step is shown as step 306 in the process flow shown in FIG. 22. Hence, metal pillars 50 and solder regions 54 are embedded in polymer layer 58, wherein the top surface of polymer layer 58 is higher than the top ends of solder regions 54. Polymer layer 58 may be formed of a material selected from the same candidate materials (such as PBO) of polymer layer 46. A die-saw is then performed on wafer 20, and semiconductor chips 22 are separated from each other, as shown in FIG. 3. The respective step is shown as step 308 in the process flow shown in FIG. 22. The separated semiconductor chips 22 are referred to as device dies 22 hereinafter.

Figure 4:
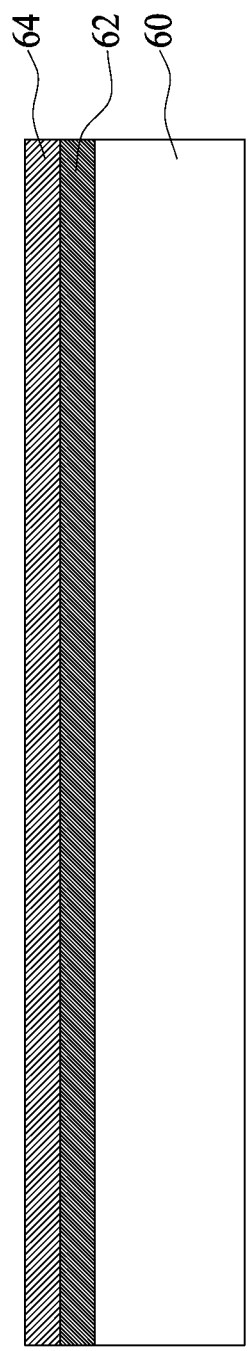
FIGS. 4 through 18 illustrate the cross-sectional views and a perspective view of intermediate stages in the packaging of device dies in accordance with some embodiments.

FIGS. 4 through 18 illustrate the packaging of device dies 22 to form InFO structures, so that the overlying electrical connectors (such as solder regions) may be distributed to regions larger than device dies 22. FIG. 4 illustrates carrier 60 and release layer 62 formed on carrier 60. Carrier 60 may be a glass carrier, a ceramic carrier, or the like. Carrier 60 may have a round top-view shape and a size of a common silicon wafer. For example, carrier 60 may have an 8-inch diameter, a 12-inch diameter, or the like. Release layer 62 may be formed of a polymer-based material (such as a Light To Heat Conversion (LTHC) material), which may be removed along with carrier 60 from the overlying structures that will be formed in subsequent steps. In some embodiments, release layer 62 is formed of an epoxy-based thermal-release material. In other embodiments, release layer 62 is formed of an ultra-violet (UV) glue. Release layer 62 may be dispensed as a liquid and cured. In alternative embodiments, release layer 62 is a laminate film and is laminated onto carrier 60. The top surface of release layer 62 is planar and has a high degree of co-planarity.

Dielectric layer 64 is formed on release layer 62. In some embodiments, dielectric layer 64 is formed of a polymer, which may also be a photo-sensitive material such as polybenzoxazole (PBO), polyimide, benzocyclobutene (BCB), or the like, which may be easily patterned using a photo lithography process. In alternative embodiments, dielectric layer 64 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 5:
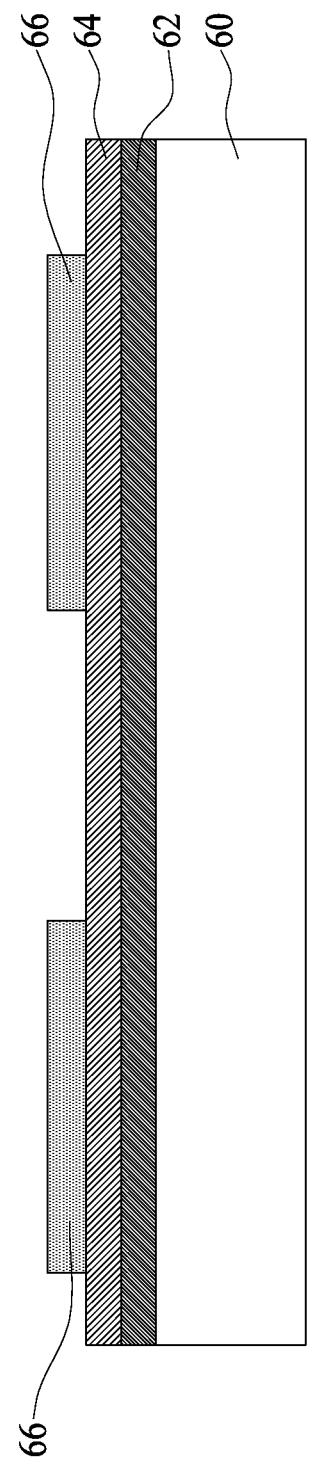

Referring to FIG. 5, Redistribution Lines (RDLs) 66 are formed over dielectric layer 64. RDLs 66 are also referred to as backside RDLs since they are located on the backside of device die 22 (FIG. 18) when the packaging is finished. The formation of RDLs 66 may include forming a seed layer (not shown) over dielectric layer 64, forming a patterned mask (not shown) such as photo resist over the seed layer, and then performing a metal plating on the exposed seed layer. The patterned mask and the portions of the seed layer covered by the patterned mask are then removed, leaving RDLs 66 as shown in FIG. 5. In accordance with some embodiments, the seed layer comprises a titanium layer and a copper layer over the titanium layer. The seed layer may be formed using, for example, PVD. The plating may be performed using, for example, electroless plating.

Figure 6:
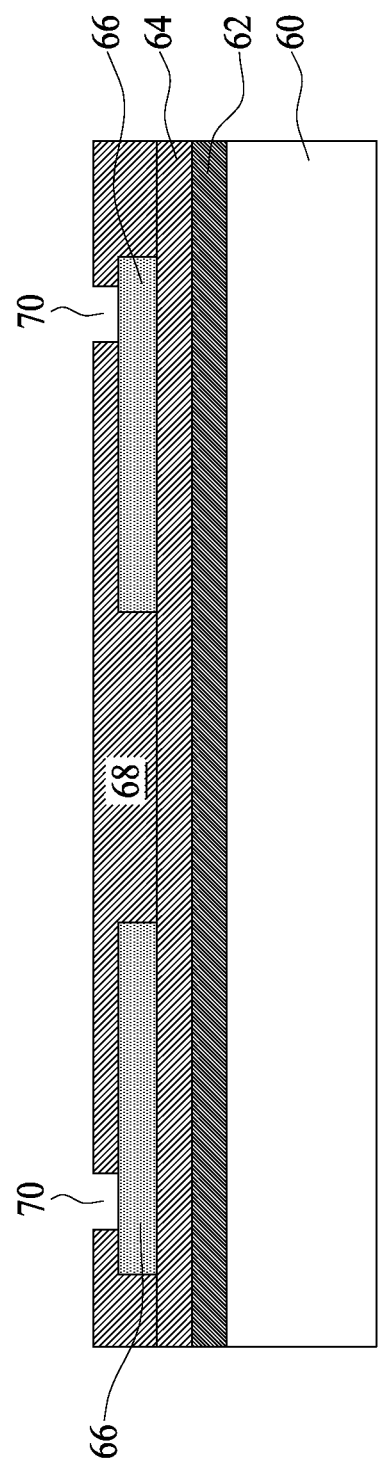

Referring to FIG. 6, dielectric layer 68 is formed over RDLs 66. The steps shown in FIGS. 4 through 6 are also shown as step 310 in the process flow shown in FIG. 22. The bottom surface of dielectric layer 68 is in contact with the top surfaces of RDLs 66 and dielectric layer 64. In accordance with some embodiments of the present disclosure, dielectric layer 68 is formed of a polymer, which may be a photo-sensitive material such as PBO, polyimide, BCB, or the like. In alternative embodiments, dielectric layer 68 is formed of a nitride such as silicon nitride, an oxide such as silicon oxide, PSG, BSG, BPSG, or the like. Dielectric layer 68 is then patterned to form openings 70 therein. Hence, RDLs 66 are exposed through the openings 70 in dielectric layer 68.

Figure 7:
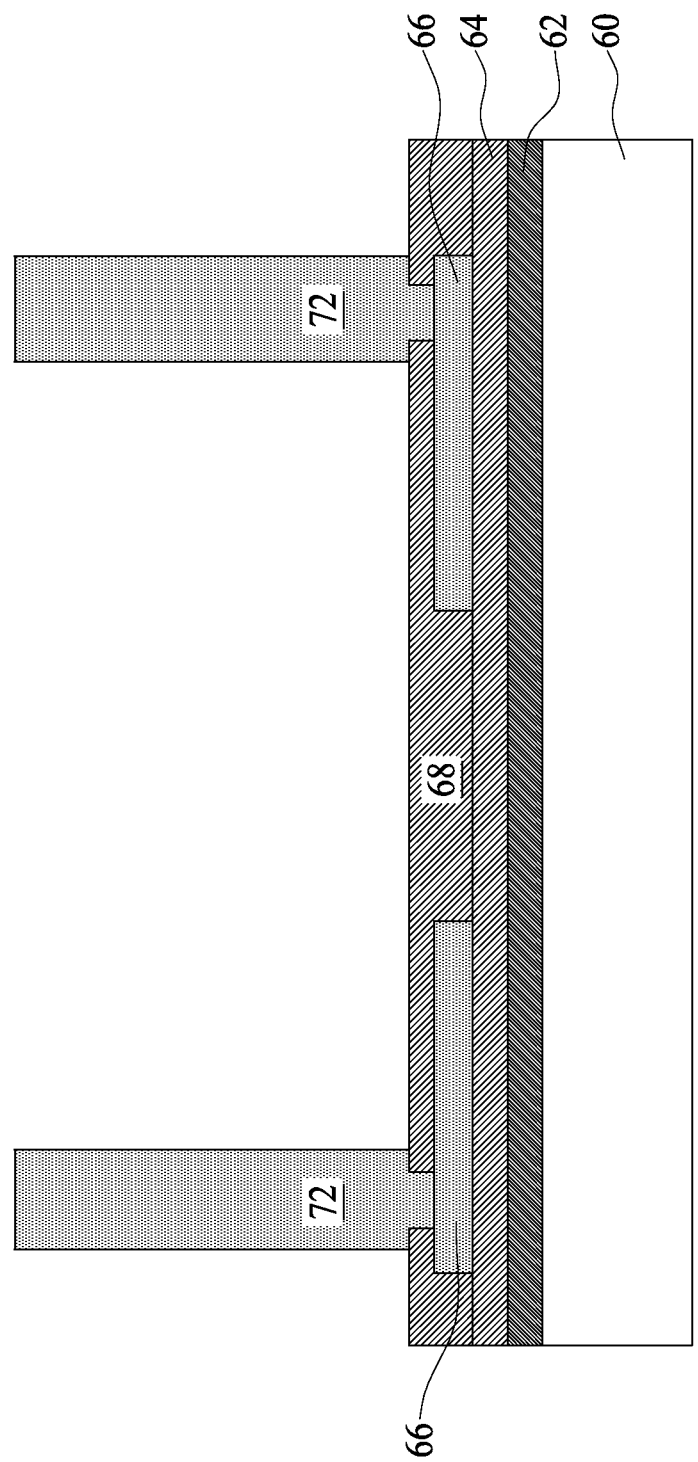

Referring to FIG. 7, metal posts 72 are formed. Throughout the description, metal posts 72 are alternatively referred to as through-vias 72 since metal posts 72 penetrate through the subsequently formed molding material. The respective step is shown as step 312 in the process flow shown in FIG. 22. In accordance with some embodiments of the present disclosure, through-vias 72 are formed by plating. The plating of through-vias 72 may include forming a blanket seed layer (not shown) over layer 68 and extending into openings 70 (FIG. 6), forming and patterning a photo resist (not shown), and plating through-vias 72 on the portions of the seed layer that are exposed through the openings in the photo resist. The photo resist and the portions of the seed layer that were covered by the photo resist are then removed. The material of through-vias 72 may include copper, aluminum, or the like. Through-vias 72 have the shape of rods. The top-view shapes of through-vias 72 may be circles, rectangles, squares, hexagons, or the like.

Figure 8:
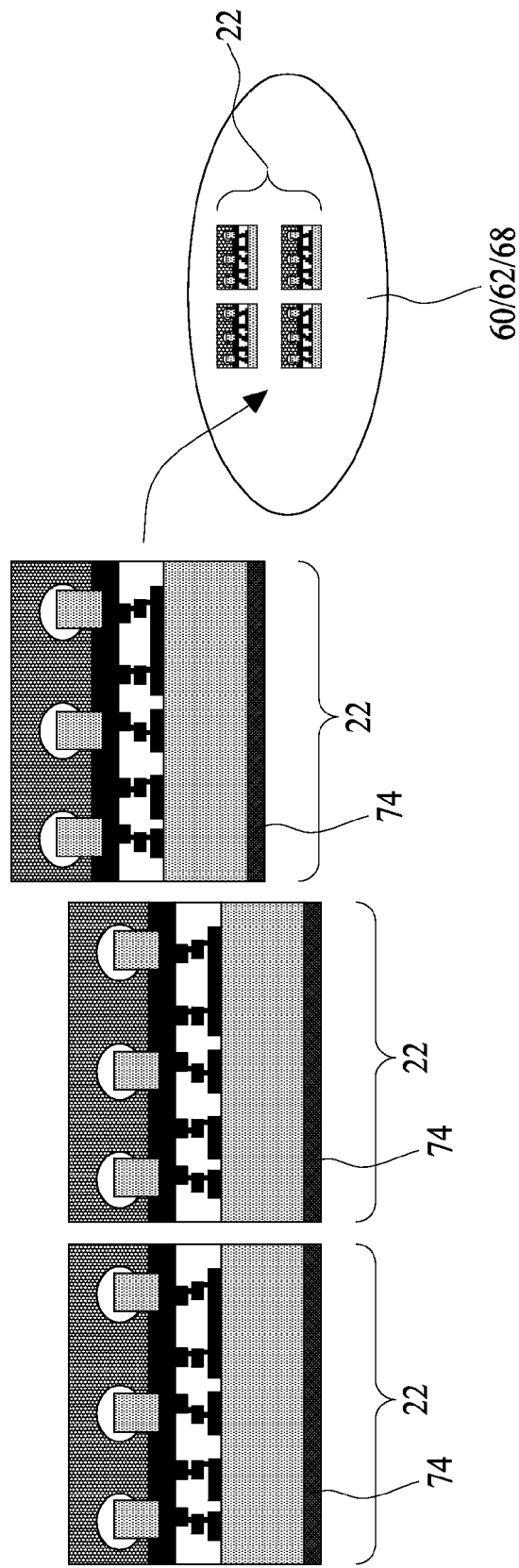

FIG. 8 illustrates the perspective view of the placement of device dies 22 onto the structure shown in FIG. 7, wherein device dies 22 are arranged as rows and columns. The respective step is shown as step 314 in the process flow shown in FIG. 22. The good dies 22 that are found during the probing are placed, and defective dies 22 are discarded. Through-vias 72 are not shown in FIG. 8, although they also exist.

Figure 9:
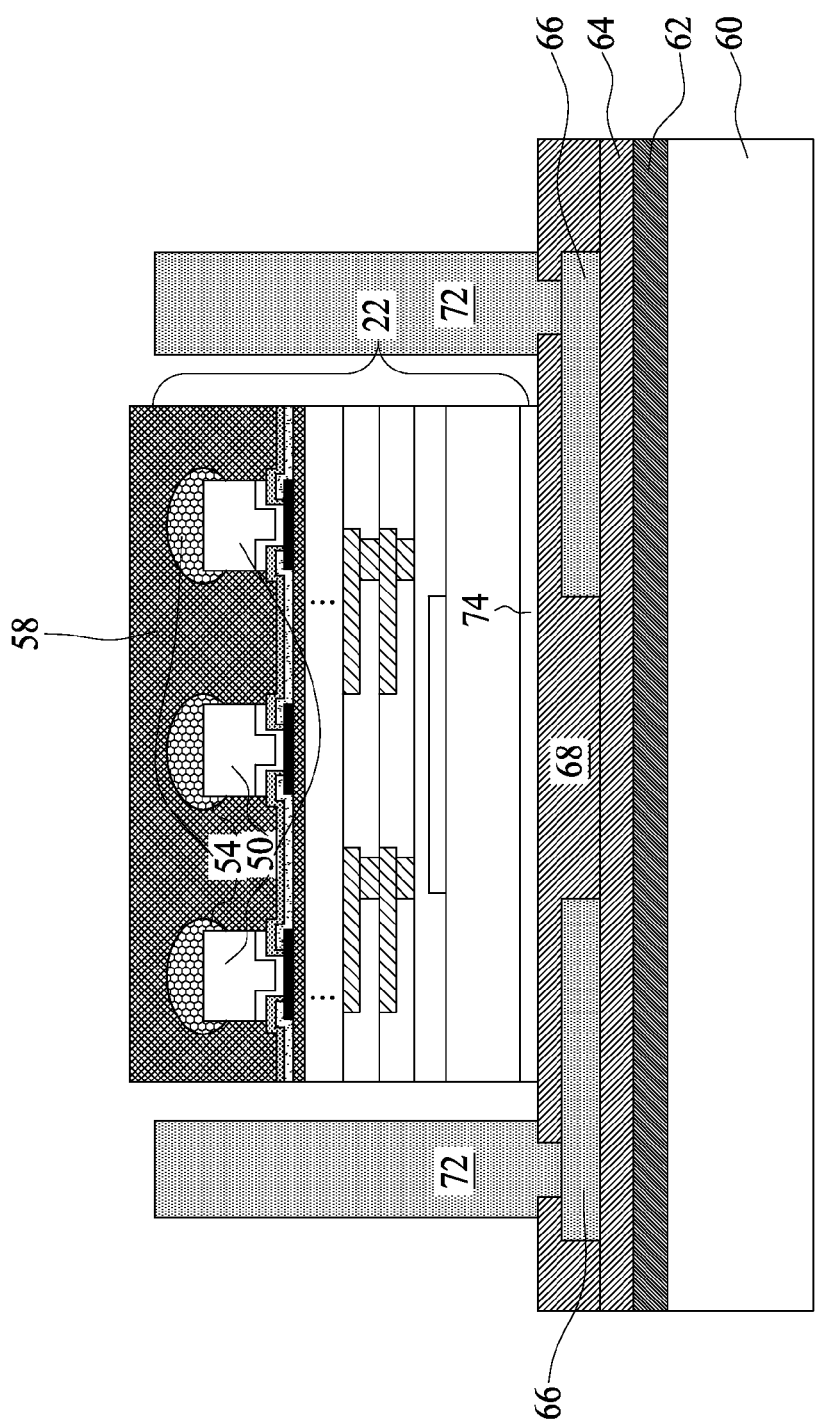

FIG. 9 illustrates the cross-sectional view of a portion of the structure shown in FIG. 8. In FIG. 9, only a single device die 22 and its surrounding through-vias 72 are illustrated. It is noted, however, that the process steps shown in FIGS. 9 through 17 are performed at wafer level, and are performed on all of device dies 22 on carrier 60. Referring to FIG. 9, device die 22 is adhered to dielectric layer 68 through Die-Attach Film (DAF) 74, which may be an adhesive film.

Figure 10:
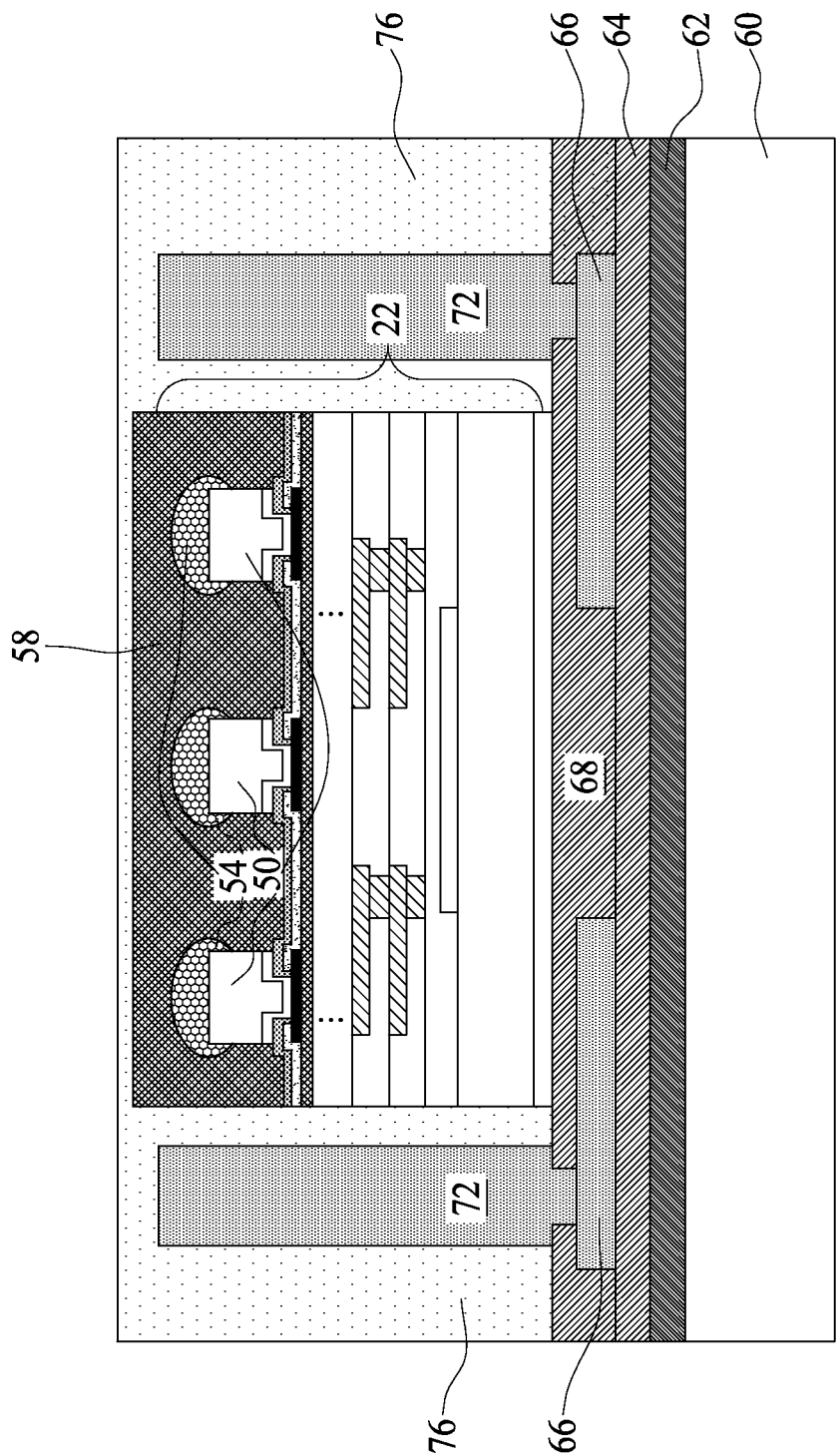

Next, referring to FIG. 10, molding material 76 is molded on device die 22. The respective step is shown as step 316 in the process flow shown in FIG. 22. Molding material 76 fills the gaps between neighboring through-vias 72 and the gaps between through-vias 72 and device die 22. Molding material 76 may include a molding compound, a molding underfill, an epoxy, or a resin. The top surface of molding material 76 is higher than the top ends of metal pillar 50 and through-vias 72.

Figure 11:
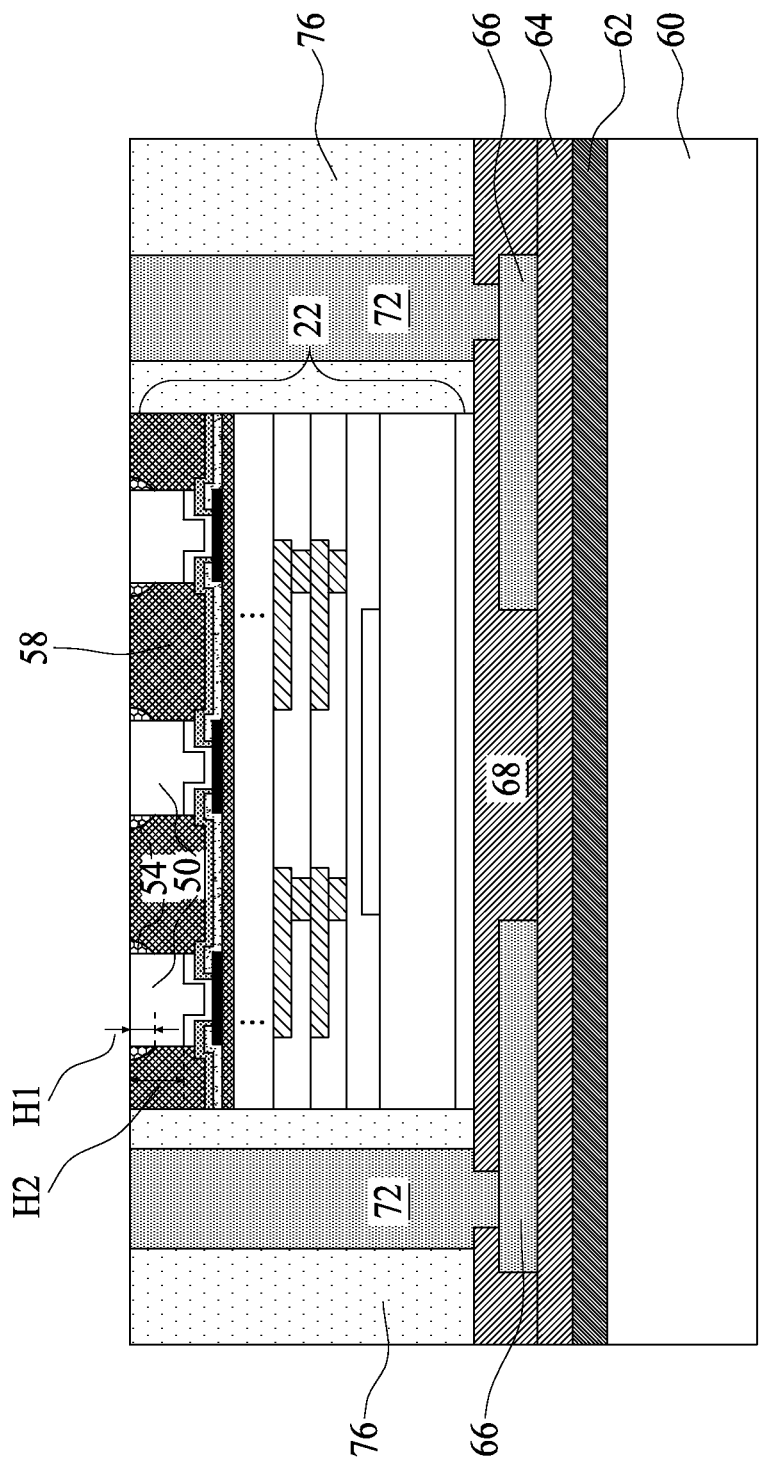

Next, as shown in FIG. 11, a planarization such as a Chemical Mechanical Polish (CMP) step or a grinding step is performed to thin molding material 76 until through-vias 72 and metal pillars 50 are exposed. The respective step is shown as step 318 in the process flow shown in FIG. 22. Due to the grinding, the top ends of through-vias 72 are level (coplanar) with the top surfaces of metal pillars 50, and are coplanar with the top surface of molding material 76. In the illustrated exemplary embodiments, the planarization is performed until metal pillars 50 are exposed. Accordingly, the portions of solder regions 54 overlapping metal pillars 50 are removed. The portions of solder regions 54 on the sidewalls of metal pillars 50 remain after the planarization. In the top view of the structure shown in FIG. 11, the remaining solder regions 54 may or may not form a full ring encircling the respective metal pillars 50.

Height H1 of the portions of solder regions 54 remaining on the sidewalls of metal pillars 50 is affected by various factors such as the reflow duration, the temperature of the reflow, the material of metal pillars 50, the amount of the solder, et al. In some exemplary embodiments, ratio H1/H2 may be in the range between about 0.2 and about 0.5, wherein H2 is the height of metal pillars 50.

Figure 12:
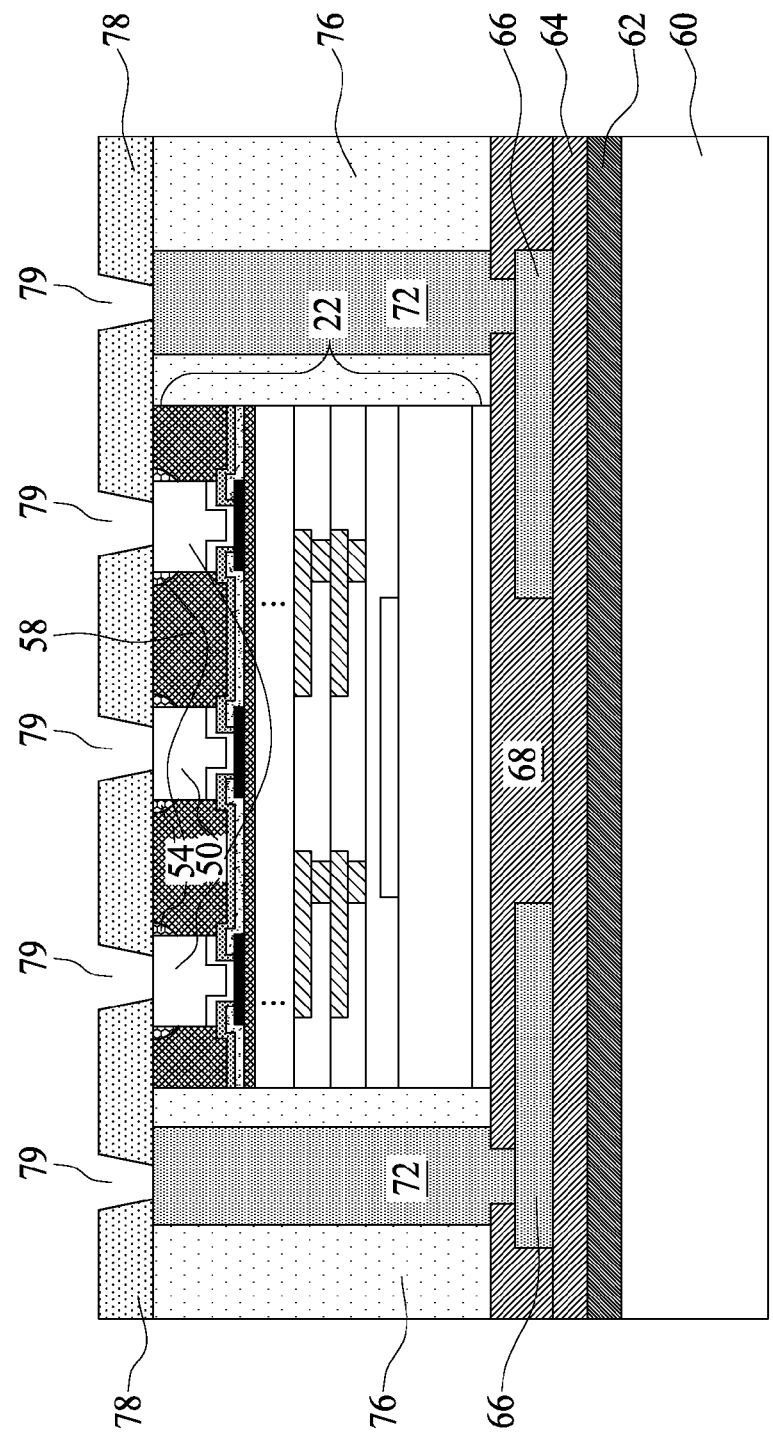

FIGS. 12 through 17 illustrate the formation of front side RDLs and solder regions. Referring to FIG. 12, dielectric layer 78 is formed. The respective step is shown as step 320 in the process flow shown in FIG. 22. In some embodiments, dielectric layer 78 is formed of a polymer such as PBO, polyimide, or the like. In alternative embodiments, dielectric layer 78 is formed of silicon nitride, silicon oxide, or the like. Openings 79 are formed in dielectric layer 78 to expose through-vias 72 and metal pillars 50. The formation of openings 79 may be performed through a photo lithography process.

Figure 13:
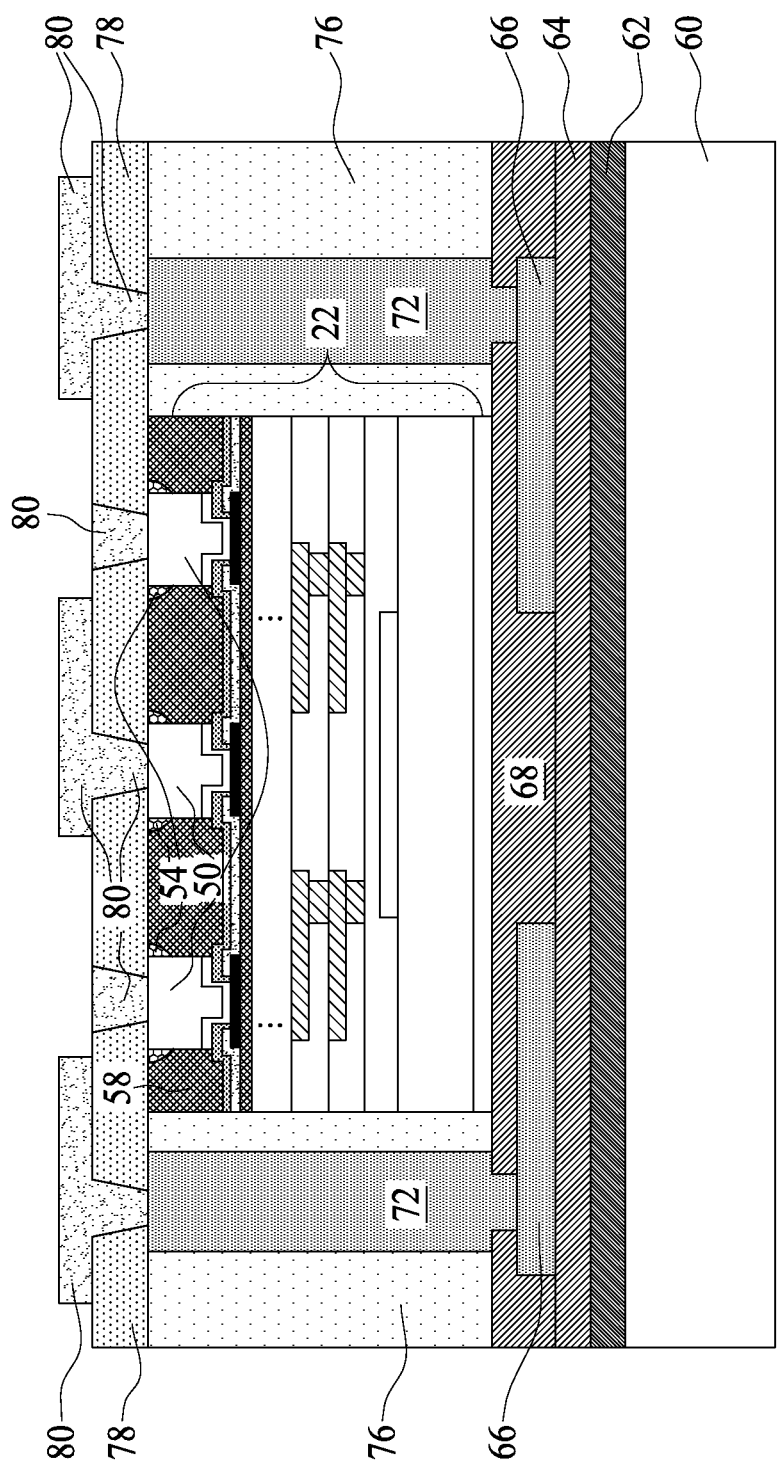

Next, referring to FIG. 13, Redistribution Lines (RDLs) 80 are formed to connect to metal pillars 50 and through-vias 72. RDLs 80 may also interconnect metal pillars 50 and through-vias 72. RDLs 80 include metal traces (metal lines) over dielectric layer 78 as well as vias extending into openings 79 (FIG. 12) to electrically connect to through-vias 72 and metal pillars 50. For simplicity, the metal lines connected to the leftmost and rightmost metal pillars 50 are not illustrated, while they are also formed. In some embodiments, RDLs 80 are formed in a plating process, wherein each of RDLs 80 includes a seed layer (not shown) and a plated metallic material over the seed layer. The seed layer and the plated material may be formed of the same material or different materials. RDLs 80 may comprise a metal or a metal alloy including aluminum, copper, tungsten, and alloys thereof. RDLs 80 are formed of non-solder materials. The via portions of RDLs 80 may be in physical contact with the top surfaces of metal pillars 50. Furthermore, the via portions of RDLs 80 may be in physical contact with the top surfaces of solder regions 54 (for example, if misalignment occurs), or physically separated from (and electrically coupled to) solder regions 54.

Figure 14:
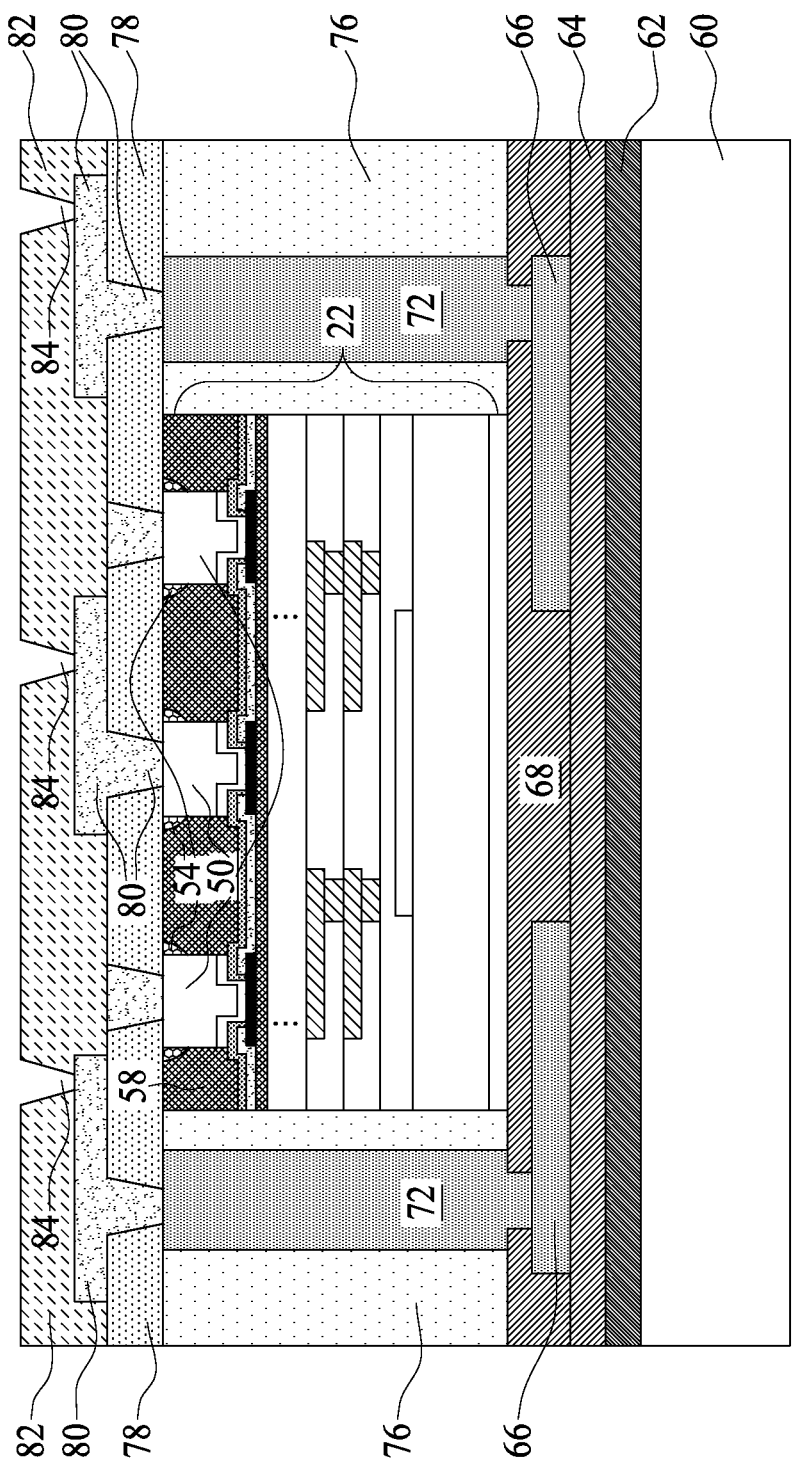

Referring to FIG. 14, dielectric layer 82 is formed over RDLs 80 and dielectric layer 78. Dielectric layer 82 may be formed using a polymer, which may be selected from the same candidate materials as those of dielectric layer 78. For example, dielectric layer 82 may comprise PBO, polyimide, BCB, or the like. Alternatively, dielectric layer 82 may include non-organic dielectric materials such as silicon oxide, silicon nitride, silicon carbide, silicon oxynitride, or the like. Openings 84 are also formed in dielectric layer 82 to expose RDLs 80. The formation of openings 84 may be performed through a photo lithography process.

Figure 15:
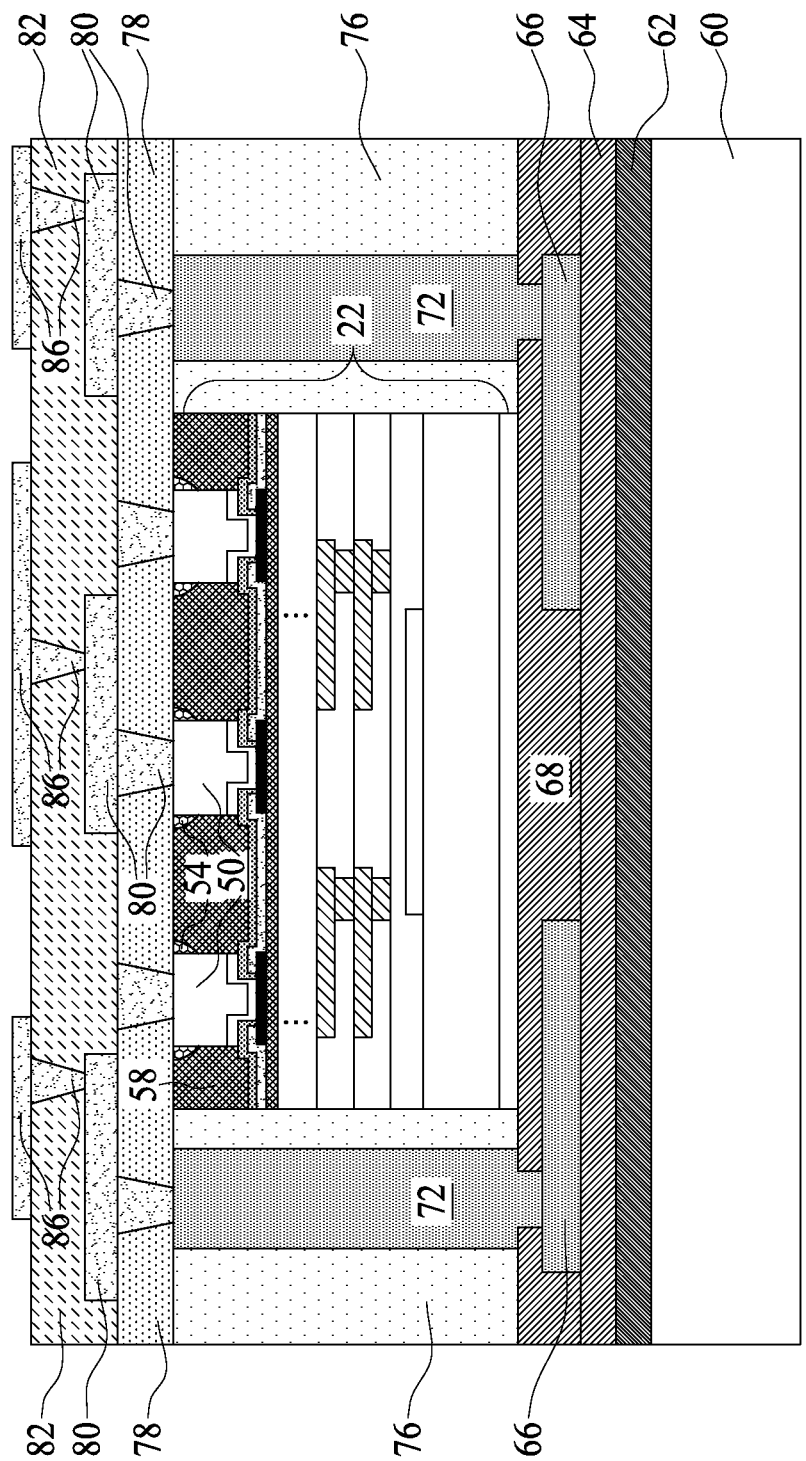

FIG. 15 illustrates the formation of RDLs 86, which are electrically connected to RDLs 80. The formation of RDLs 86 may adopt similar methods and materials to those for forming RDLs 80. RDLs 86 and 80 are also referred to as front-side RDLs since they are located on the front side of device die 22.

Figure 16:
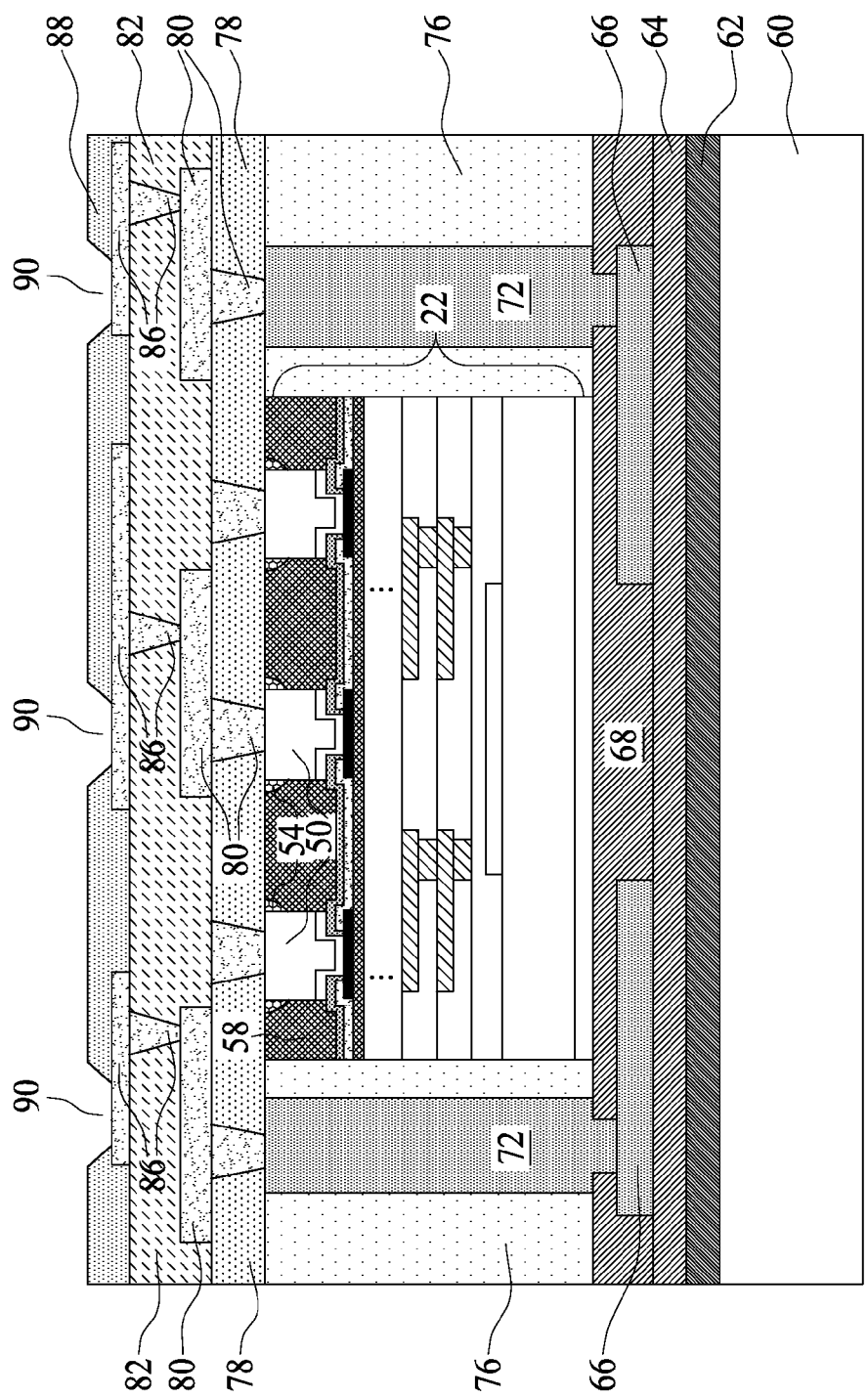

As shown in FIG. 16, an additional dielectric layer 88, which may be a polymer layer, is formed to cover RDLs 86 and dielectric layer 82. Dielectric layer 88 may be selected from the same candidate polymers used for forming dielectric layers 78 and 82. Opening(s) 90 are then formed in dielectric layer 88 to expose the metal pad portions of RDLs 86.

Figure 17:
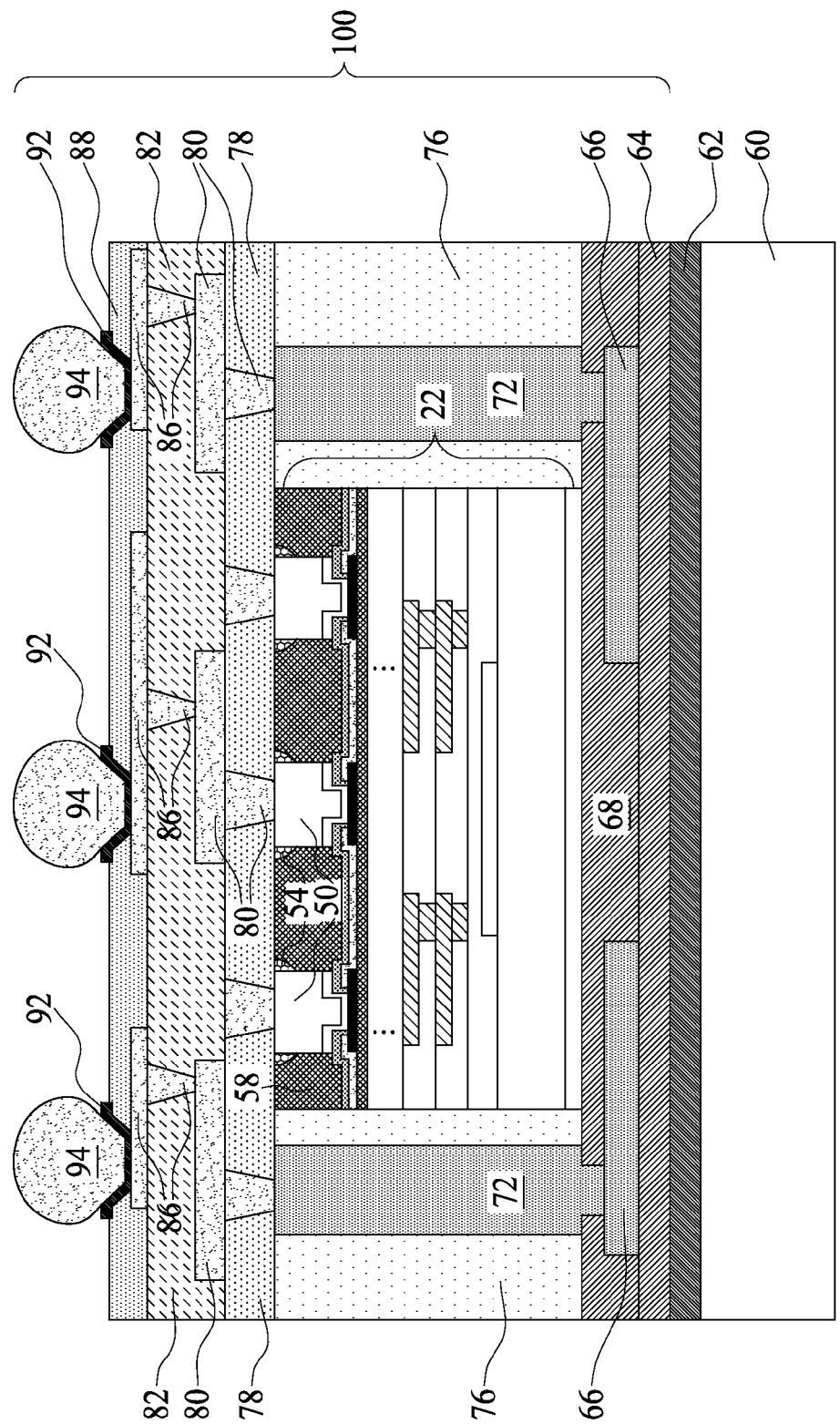

FIG. 17 illustrates the formation of Under-Bump Metallurgies (UBMs) 92 and electrical connectors 94 in accordance with some exemplary embodiments. The formation of UBMs 92 may include deposition and patterning. The formation of electrical connectors 94 may include placing solder balls on the exposed portions of UBMs 92 and then reflowing the solder balls. In alternative embodiments, the formation of electrical connectors 94 includes performing a plating step to form solder regions over RDLs 86 and then reflowing the solder regions. Electrical connectors 94 may also include metal pillars or metal pillars and solder caps, which may also be formed through plating. Throughout the description, the combined structure including device die 22, through-vias 72, molding material 76, and the corresponding RDLs and dielectric layers will be referred to as package 100, which may be a composite wafer with a round top-view shape.

Next, package 100 is de-bonded from carrier 60. The respective step is shown as step 322 in the process flow shown in FIG. 22. Release layer 62 is also cleaned from package 100. The de-bonding may be performed by projecting a light such as UV light or laser on release layer 62 to decompose release layer 62.

In the de-bonding, a tape (not shown) may be adhered onto dielectric layer 88 and electrical connectors 94. In subsequent steps, carrier 60 and release layer 62 are removed from package 100. A die saw step is performed to saw package 100 into a plurality of packages, each including device die 22 and through-vias 72. One of the resulting packages is shown as package 102 in FIG. 18.

Figure 18:
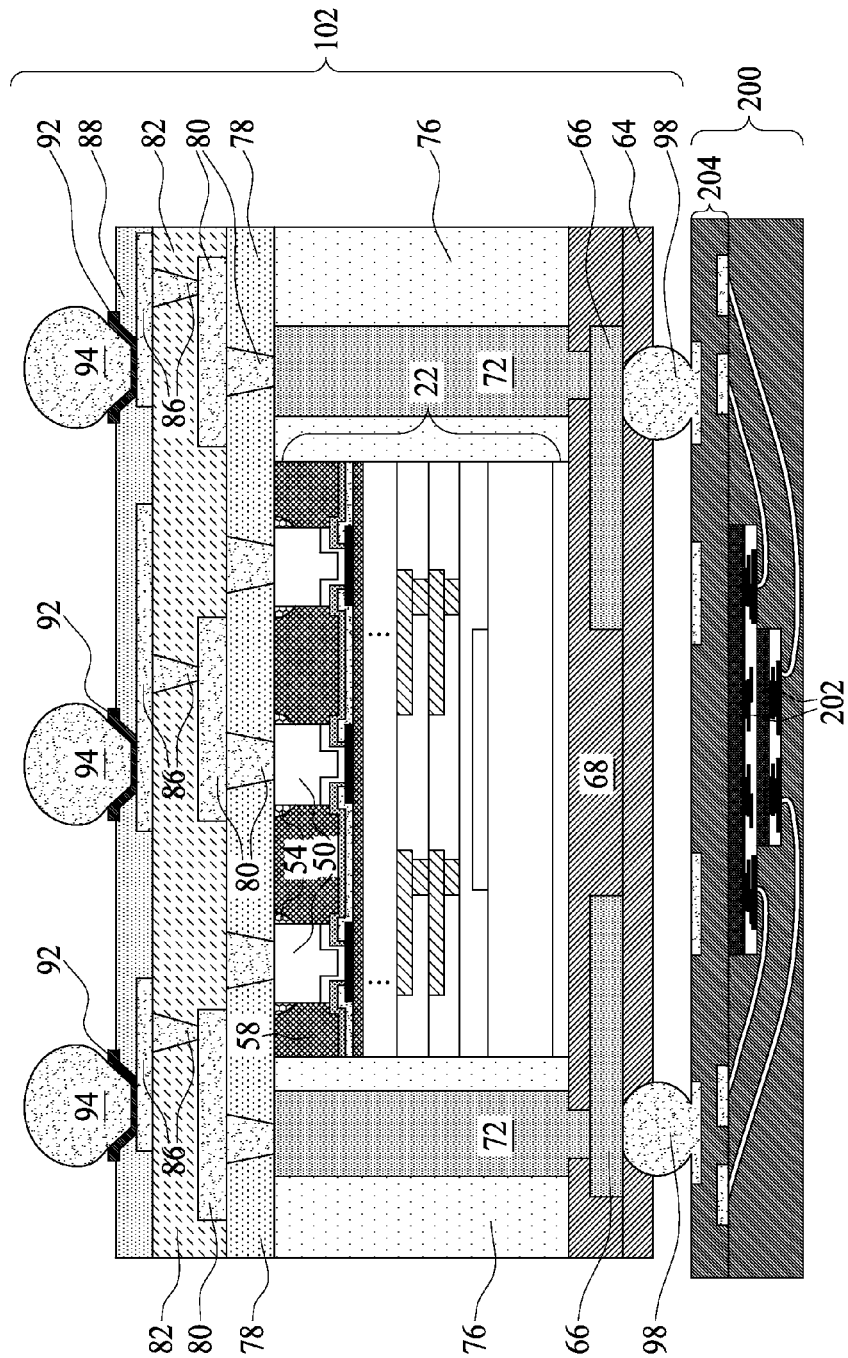

FIG. 18 illustrates the bonding of package 102 with another package 200. The respective step is shown as step 324 in the process flow shown in FIG. 22. In accordance with some embodiments of the present disclosure, the bonding is performed through solder regions 98, which join the metal pad portions of RDLs 66 to the metal pads in package 200. In some embodiments, package 200 includes device dies 202, which may be memory dies such as Static Random Access Memory (SRAM) dies, Dynamic Random Access Memory (DRAM) dies, or the like. The memory dies may also be bonded to package substrate 204 in some exemplary embodiments.

Figure 19:
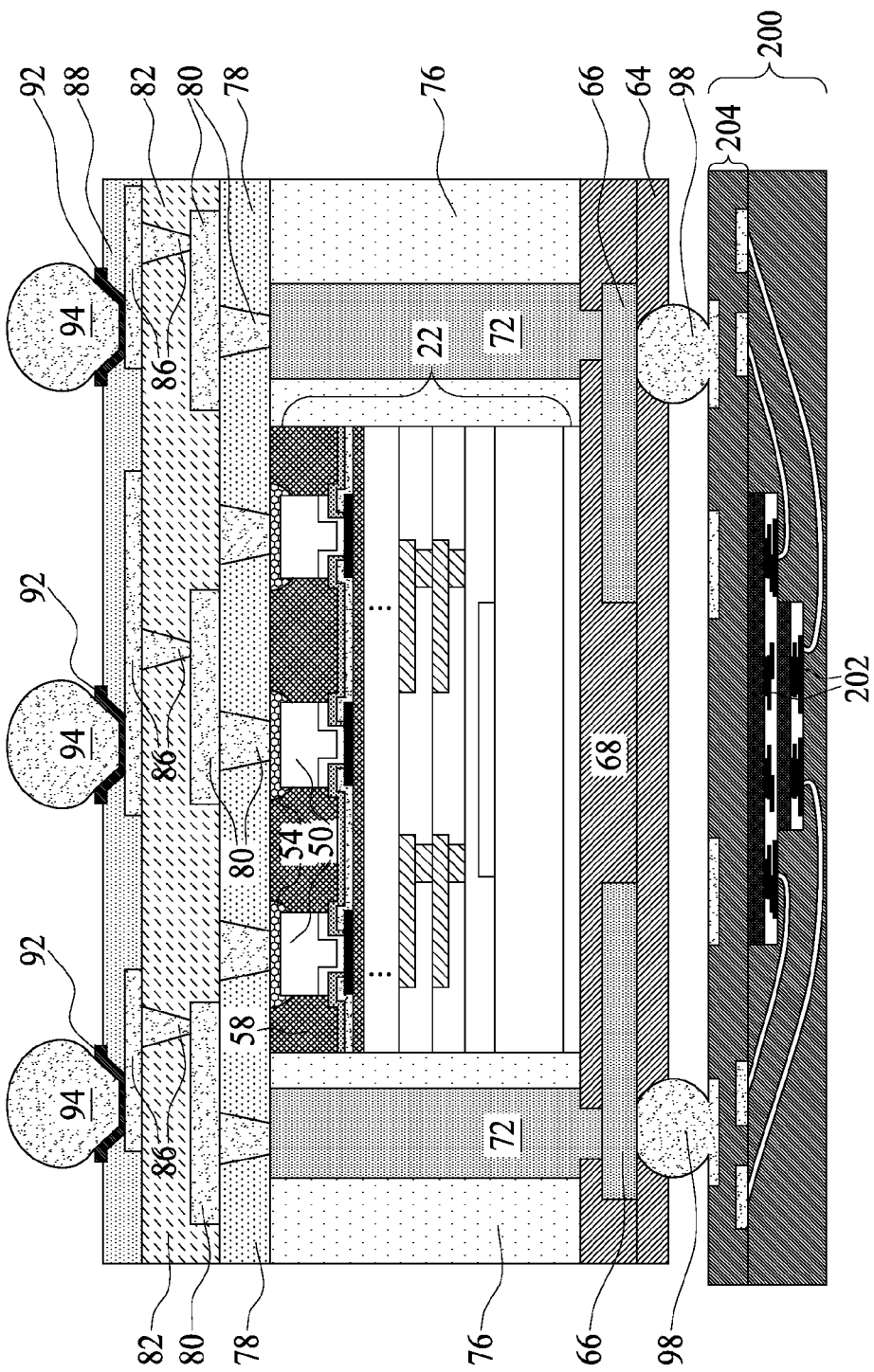
FIGS. 19 through 21 are cross-sectional views of the packages in accordance with some embodiments.
Figure 20:
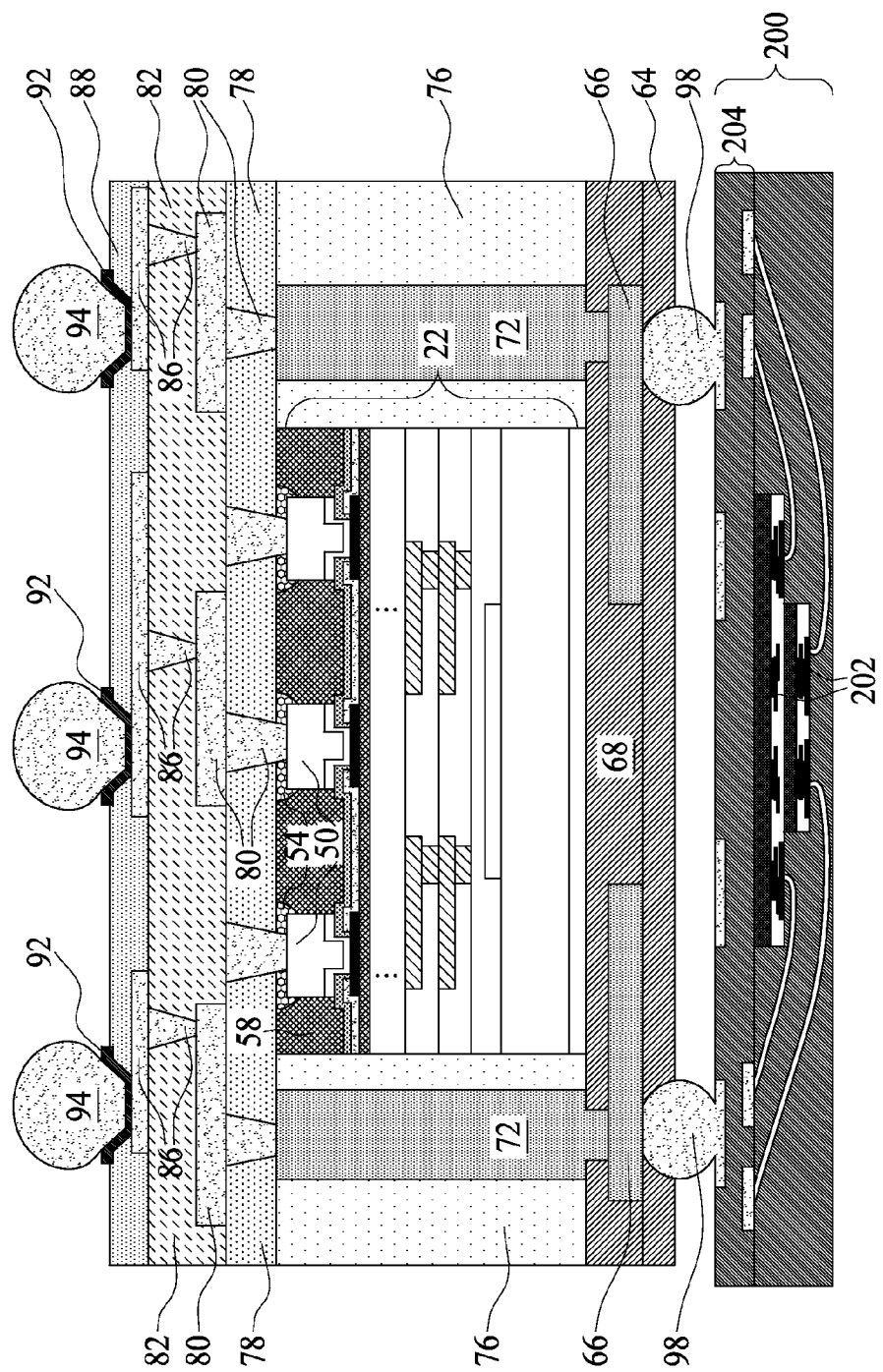
Figure 21:
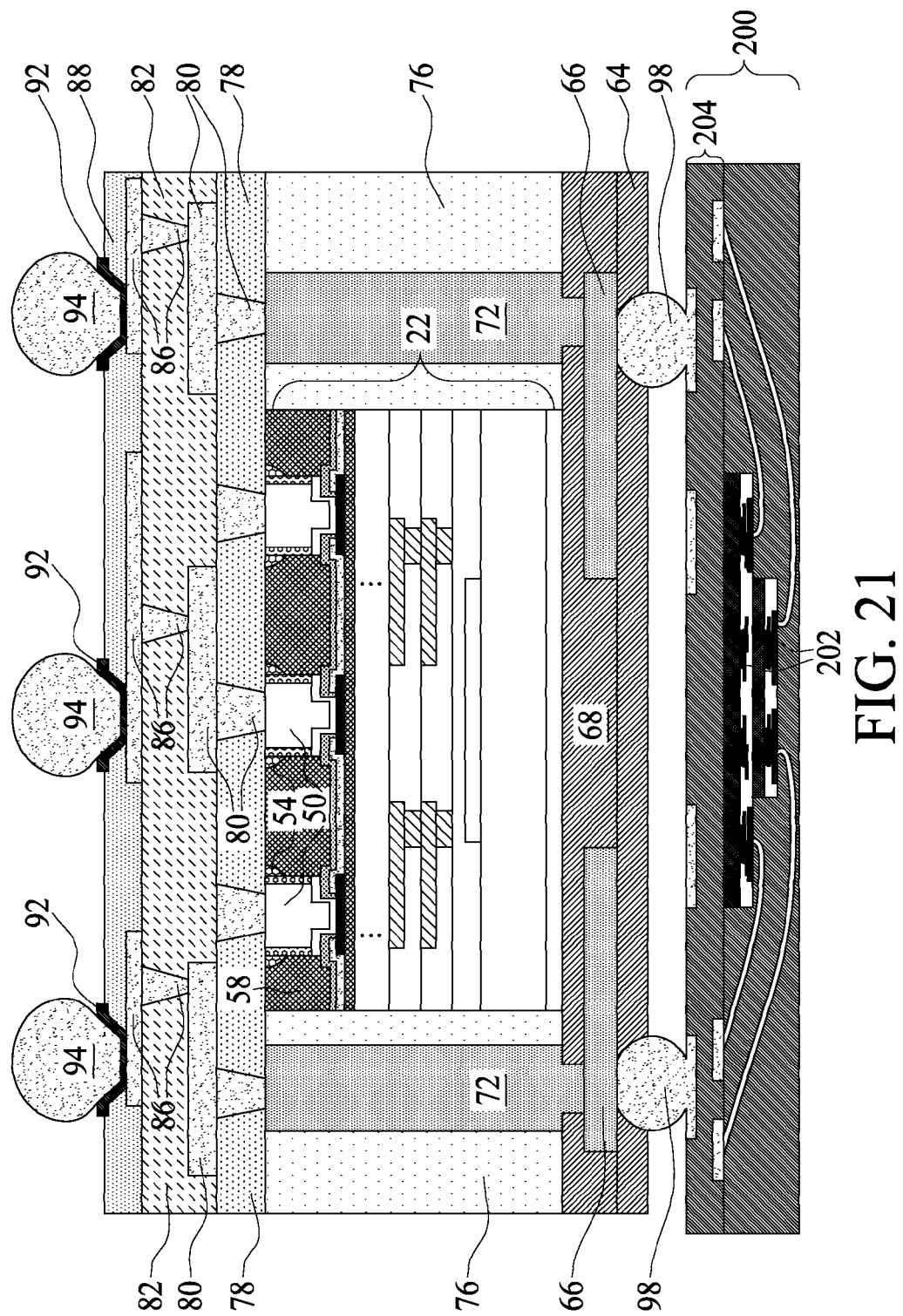

FIGS. 19 through 21 illustrate the cross-sectional views of packages formed in accordance with alternative embodiments of the present disclosure. Unless specified otherwise, the materials and the formation methods of the components in these embodiments are essentially the same as the like components, which are denoted by like reference numerals in the embodiments shown in FIGS. 1 through 18. The details regarding the formation process and the materials of the components shown in FIGS. 19 through 21 may thus be found in the discussion of the embodiment shown in FIGS. 1 through 18.

The package in FIG. 19 is similar to the package in FIG. 18, except that solder regions 54 have portions remaining overlapping metal pillars 50. This is formed since in the planarization step in 11, the planarization is stopped before the portions of solder regions 54 overlapping metal pillars 50 are fully removed. Accordingly, in the resulting structure as shown in FIG. 19, solder regions 54 physically separate the via portions of RDLs 80 and the underlying metal pillars 50 from each other, and electrically connect RDLs 80 to the respective metal pillars 50. The top surfaces of solder regions 54 are also planar with the top surfaces of through-vias 72, molding material 76, and polymer layer 58.

FIG. 20 illustrates the cross-sectional view of a package in accordance with alternative embodiments. The structure shown in FIG. 20 is similar to the structure shown in FIG. 19, except that the via portions of RDLs penetrate through solder regions 54 to contact to the top surfaces of metal pillars 50. The via portions of RDLs 80 may be encircled by the respective solder regions 54. The respective formation process includes an etching step to etching through solder regions 54 when dielectric layer 78 is patterned.

FIG. 21 illustrates the cross-sectional view of a package in accordance with alternative embodiments. The structure shown in FIG. 20 is similar to the structure shown in FIG. 18, except that diffusion barrier layers 52 are formed on the sidewalls of metal pillars 50, and separate metal pillars 50 from solder regions 54.

The embodiments of the present disclosure have some advantageous features. By forming the solder regions on the metal pillars, and then probing the respective device dies through the solder regions, the reliability in the probing is improved.

In accordance with some embodiments of the present disclosure, a package includes a device die, which includes a metal pillar at a top surface of the device die, and a solder region on a sidewall of the metal pillar. A molding material encircles the device die, wherein a top surface of the molding material is substantially level with a top surface of the device die. A dielectric layer overlaps the molding material and the device die, with a bottom surface of the dielectric layer contacting a top surface of the device die and a top surface of the molding material. An RDL extends into the dielectric layer to electrically couple to the metal pillar.

In accordance with alternative embodiments of the present disclosure, a package includes a device die, which includes a substrate, a metal pillar at a surface of the device die, a solder region with a portion on a sidewall of, and electrically coupled to, the metal pillar, and a polymer layer encircling the metal pillar. At least one of the metal pillar and the solder region has a top surface substantially level with a top surface of the polymer layer, and the polymer layer and the substrate are co-terminus. The package further includes a molding material encircling the device die, with edges of the molding material contacting edges of the polymer layer, and a through-via penetrating through the molding material. A dielectric layer is over the device die and the molding material. A first plurality of redistribution lines overlies the molding material, wherein a first one of the first plurality of redistribution lines has a via portion penetrating through the dielectric layer to contact the top surface of the at least one of the metal pillar and the solder region. A second plurality of redistribution lines underlies the molding material, wherein a second one of the first plurality of redistribution lines is electrically coupled to one of the second plurality of redistribution lines through the through-via.

In accordance with yet alternative embodiments of the present disclosure, a method includes forming solder regions on top surfaces and sidewalls of metal pillars of a device die, and probing the device die by contacting probe pins to the solder regions. After the probing, the device die is molded in a molding material. The device die and the molding material are planarized, wherein top surfaces of the solder regions are level with a top surface of the molding material, and at least portions of the solder region over the metal pillars are removed. A dielectric layer is formed over and contacting the device die and the molding material. Redistribution lines are formed and including via portions penetrating through the dielectric layer, wherein each of the via portions is in contact with at least one of the solder regions and the metal pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a device die comprising:
      a metal pillar at a top surface of the device die; and
      a solder region on a sidewall of the metal pillar;
   a molding material encircling the device die, wherein a top surface of the molding material is substantially level with a top surface of the device die;
   a dielectric layer overlapping the molding material and the device die, with a bottom surface of the dielectric layer contacting a top surface of the device die and a top surface of the molding material; and
   a redistribution line (RDL) extending into the dielectric layer to electrically couple to the metal pillar.

2. The package of claim 1 further comprising a through-via penetrating through the molding material, wherein a top surface of the through-via is substantially coplanar with the top surface of the device die.

3. The package of claim 1, wherein a bottom surface of the RDL contacts a top surface of the metal pillar, and a top surface of the solder region is coplanar with the top surface of the metal pillar.

4. The package of claim 1, wherein a bottom surface of the RDL contacts a top surface of the solder region, and the solder region comprises a portion overlapping the metal pillar.

5. The package of claim 1, wherein a via portion of the RDL penetrates through a top portion of the solder region to contact a top surface of the metal pillar.

6. The package of claim 1 further comprising a diffusion barrier layer encircling the metal pillar, with the diffusion barrier layer in physical contact with the metal pillar and the solder region, and separating the metal pillar and the solder region from each other.

7. The package of claim 1, wherein the metal pillar is formed of a non-solder metallic material.

8. The package of claim 1, wherein the device die further comprises a polymer encircling the metal pillar, wherein an upper portion of a sidewall of the metal pillar is in physical contact with the solder region, and a lower portion of the sidewall of the metal pillar is in physical contact with the polymer.

9. A package comprising:
   a device die comprising:
      a substrate;
      a metal pillar at a surface of the device die;
      a solder region with a portion on a sidewall of, and electrically coupled to, the metal pillar; and
      a polymer layer encircling the metal pillar, wherein at least one of the metal pillar and the solder region has a top surface substantially level with a top surface of the polymer layer, and the polymer layer and the substrate are co-terminus;
   a molding material encircling the device die, with edges of the molding material contacting edges of the polymer layer;
   a through-via penetrating through the molding material;
   a dielectric layer over the device die and the molding material;
   a first plurality of redistribution lines overlying the molding material, wherein a first one of the first plurality of redistribution lines has a via portion penetrating through the dielectric layer to contact the top surface of the at least one of the metal pillar and the solder region; and
   a second plurality of redistribution lines underlying the molding material, wherein a second one of the first plurality of redistribution lines is electrically coupled to one of the second plurality of redistribution lines through the through-via.

10. The package of claim 9, wherein the second one of the first plurality of redistribution lines comprises an additional via portion penetrating through the dielectric layer to contact the through-via.

11. The package of claim 9, wherein the via portion of the first one of the first plurality of redistribution lines is in physical contact with the top surface of the metal pillar.

12. The package of claim 11, wherein the via portion of the first one of the first plurality of redistribution lines is physically separated from the solder region.

13. The package of claim 9, wherein the via portion of the first one of the first plurality of redistribution lines is in physical contact with the top surface of the solder region, with a portion of the solder region overlapping the metal pillar.

14. The package of claim 9, wherein the via portion of the first one of the first plurality of redistribution lines penetrates through the solder region to physically contact the solder region, and the top surface of the solder region is level with the top surface of the polymer layer.

15. A package comprising:
   a device die comprising:
      a metal pillar;

a solder region contacting a top portion of a sidewall of the metal pillar, wherein a top surface of the metal pillar is coplanar with a top surface of the solder region; and
a first dielectric layer contacting a bottom portion of the sidewall of the metal pillar and an outer sidewall of the solder region;
a second dielectric layer over and contacting the device die, wherein the second dielectric layer extends laterally beyond edges of the device die; and
a plurality of redistribution lines, wherein one of the plurality of redistribution lines has a via portion penetrating through the second dielectric layer to contact the top surface of the metal pillar, and additional portions overlying the second dielectric layer.

16. The package of claim 15, wherein the solder region has a non-flat bottom surface.

17. The package of claim 15, wherein in a cross-sectional view of the metal pillar and the solder region, upper portions of the solder region are wider than lower portions of the solder region.

18. The package of claim 15, wherein the solder region comprises portions on opposite sides of the metal pillar.

19. The package of claim 15, wherein the via portion of the one of the plurality of redistribution lines is physically separated from, and electrically coupled to, the solder region.

20. The package of claim 15 further comprising an encapsulating material encapsulating the device die therein, wherein the top surface of the metal pillar and the top surface of the solder region are coplanar with a top surface of the encapsulating material.

* * * * *